(12) United States Patent
Laidig

(10) Patent No.: US 7,231,629 B2
(45) Date of Patent: Jun. 12, 2007

(54) FEATURE OPTIMIZATION USING ENHANCED INTERFERENCE MAPPING LITHOGRAPHY

(75) Inventor: Thomas Laidig, Point Richmond, CA (US)

(73) Assignee: ASML Masktools B.V., Veldhoven (NL)

( * ) Notice: Subject to any disclaimer, the term of this patent is extended or adjusted under 35 U.S.C. 154(b) by 231 days.

(21) Appl. No.: 10/976,306

(22) Filed: Oct. 29, 2004

(65) Prior Publication Data

US 2005/0149900 A1 Jul. 7, 2005

Related U.S. Application Data

(60) Provisional application No. 60/515,708, filed on Oct. 31, 2003.

(51) Int. Cl.
   *G06F 17/50* (2006.01)
(52) U.S. Cl. ............... 716/21; 716/19; 716/20
(58) Field of Classification Search ........... 716/19–21; 430/5, 311, 296
   See application file for complete search history.

(56) References Cited

U.S. PATENT DOCUMENTS

| | | |
|---|---|---|
| 5,229,230 A | 7/1993 | Kamon |
| 5,682,323 A | 10/1997 | Pasch et al. |
| 5,895,741 A | 4/1999 | Hasegawa et al. |
| 6,214,497 B1 | 4/2001 | Stanton |
| 6,223,139 B1 | 4/2001 | Wong et al. |
| 6,303,253 B1 | 10/2001 | Lu |
| 6,355,382 B1 | 3/2002 | Yasuzato et al. |
| 6,413,684 B1 | 7/2002 | Stanton |
| 6,519,760 B2 | 2/2003 | Shi et al. |
| 6,777,141 B2 | 8/2004 | Pierrat |
| 6,787,271 B2 | 9/2004 | Cote et al. |
| 6,792,591 B2 | 9/2004 | Shi et al. |
| 6,807,662 B2 | 10/2004 | Toublan et al. |

(Continued)

FOREIGN PATENT DOCUMENTS

EP   1 202 119 A1   5/2002

(Continued)

OTHER PUBLICATIONS

Robert Socha, et al., "Contact Hole Reticle Optimization by Using Interference Mapping Lithography (IML™ )," Proceedings of the SPIE, Apr. 14, 2004, pp. 516-534, vol. 5446, No. 1, SPIE.

(Continued)

*Primary Examiner*—Vuthe Siek
(74) *Attorney, Agent, or Firm*—McDermott Will & Emery LLP

(57) ABSTRACT

Disclosed concepts include a method of, and program product for, optimizing an intensity profile of a pattern to be formed in a surface of a substrate relative to a given mask using an optical system. Steps include mathematically representing resolvable feature(s) from the given mask, generating a mathematical expression, an eigenfunction, representing certain characteristics of the optical system, modifying the mathematical the eigenfunction by filtering, generating an interference map in accordance with the filtered eigenfunction and the mathematical expression of the given mask, and determining assist features for the given mask based on the interference map. As a result, undesired printing in the surface of the substrate may be minimized.

27 Claims, 7 Drawing Sheets
(6 of 7 Drawing Sheet(s) Filed in Color)

U.S. PATENT DOCUMENTS

| | | |
|---|---|---|
| 2002/0083410 A1 | 6/2002 | Wu et al. |
| 2002/0152452 A1 | 10/2002 | Socha |
| 2002/0157081 A1 | 10/2002 | Shi et al. |
| 2003/0082463 A1 | 5/2003 | Laidig et al. |
| 2003/0228541 A1 | 12/2003 | Hsu et al. |
| 2004/0122636 A1 | 6/2004 | Adam |
| 2004/0209170 A1 | 10/2004 | Broeke et al. |
| 2004/0229133 A1* | 11/2004 | Socha et al. .................... 430/5 |

FOREIGN PATENT DOCUMENTS

| | | |
|---|---|---|
| EP | 1 237 046 A2 | 9/2002 |
| EP | 1 439 419 A | 7/2004 |
| EP | 1 439 420 A | 7/2004 |
| WO | WO 02/03140 A1 | 1/2002 |
| WO | WO 2003/054626 A1 | 7/2003 |

OTHER PUBLICATIONS

Douglas Van Den Broeke, et al., "Model-based RET using interface maps, algorithms for random contacts at 65 nm," Solid State Technology, Sep. 2004, pp. 63-64, 66, vol. 47, No. 9, Penwell Corporation.

Douglas Van Den Broeke, et al., "Near 0.3 k, Full Pitch Range Contact Hole Patterning Using Chromeless Phase Lithography (CPL)," Proceedings of the SPIE, Sep. 9, 2003, pp. 297-308, vol. 5256, SPIE.

Christoph Dolainsky, et al., "Simulation based method for sidelobe suppression," Optical Microlithography XIII, Proceedings of SPIE, 2000, pp. 1156-1162, vol. 4000.

Kyoji Nakajo, et al.; "Auxiliary pattern generation to cancel unexpected images at sidelobe overlap regions in attenuated phase-shift masks," .

Nicolas Bailey Cobb, "Fast Optical and Process Proximity Correction Algorithms for Integrated Circuit Manufacturing," Ph.D. dissertation, Spring 1998, pp. 35-72, University of California at Berkeley.

J. Fung Chen, et al., "Practical I-Line OPC Contact Masks for Sub-0.3Micron Design Rule Appiciation: Part 1--OPC Design Optimization," pp. 181-201.

J.A. Torres, et al., "Contrast-Based Assist Feature Optimization," Optical Microlithography XV, 2002, pp. 179-187, Proceedings of SPIE, vol. 4691, SPIE.

Olivier Toublan, et al., "Fully Automatic Side Lobe Detection and Correction Technique for Attenuated Phase Shift Masks," Optical Microlithography XIV, 2001, pp. 1541-1547, Proccedings of SPIE, vol. 4346, SPIE.

Michael S. Yeung, "Extension of the Hopkins theory of partially coherent imaging to include thin-film interference effects," Optical/Laser Microlithography VI, 1993, pp. 452-463, SPIE, vol. 1927.

* cited by examiner clip1-filtered

FEATURE OPTIMIZATION USING ENHANCED INTERFERENCE MAPPING LITHOGRAPHY

CLAIM OF PRIORITY

The present invention claims priority form U.S. provisional application No. 60/515,708, and entitled "Eigenfunction Filtering for Interference Map Technology," filed Oct. 31, 2003.

FIELD OF THE INVENTION

The present invention relates of a photolithographic method for optimizing the intensity profile of a pattern to be formed on a surface of a substrate to minimize undesired printing (i.e., imaging).

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. Even another goal is to optimize illumination and enhance the contrast of an image on a wafer. Even yet another goal is to increase Depth of Focus (DOF) and Exposure Latitude (EL). However, because of the increasingly microscopic size of lithographic features, such as contact holes, it becomes increasingly difficult to pass light through a corresponding hole on a mask. This in turn lessens the DOF and EL. Conventional techniques to overcome this problem include placing assist features on the mask so as to increase intensity of the light on the feature being created which also will increase DOF and EL. However, there has yet to be created optimization and model methods for determining the most optimal location of assist features. Rather, assist features are placed after human inspection of test substrates. As such, the correction offered utilizing assist features is often limited by the skill and ability of person/designer responsible for placement of the assist features. There has further yet to be developed a way to optimize assist feature size. This has also been limited to the skill and ability of the person/designer.

The following description discusses novel method and apparatus for performing this method for creating maximum-sized assist features (to get the greatest benefit) without undesired printing.

SUMMARY

The disclosed concepts include a method and program product for optimizing an intensity profile of a pattern to be formed in a surface of a substrate relative to a given mask using an optical system. This is accomplished by mathematically representing resolvable feature(s) from the given mask and generating an interference map representation therefore. In generating the interference map, characteristics of the optical system may be represented by eigenfunctions. Assist feature definition based directly on these eigenfunctions will have the greatest benefit in terms of maximizing intensity at the contact centers, but undesirable printing often results. Nothing in this direct method prevents such printing, which may be exacerbated by approximation errors introduced by converting from the intrinsically continuous-tone interference map to a discrete-tone mask. Undesired printing is minimized because the enhanced interference map, and the mask generated therefrom, minimize local imbalances of assist features that cause undesired printing.

The foregoing and other features, aspects, and advantages of the present invention will become more apparent from the following detailed description of the present invention when taken in conjunction with the accompanying drawings.

BRIEF DESCRIPTION OF THE DRAWINGS

The file of this patent contains at least one drawing/photograph executed in color. Copies of this patent with color drawing(s)/photograph(s) will be provided by the Office upon request and payment of the necessary fee.

DESCRIPTION

Figure 1:
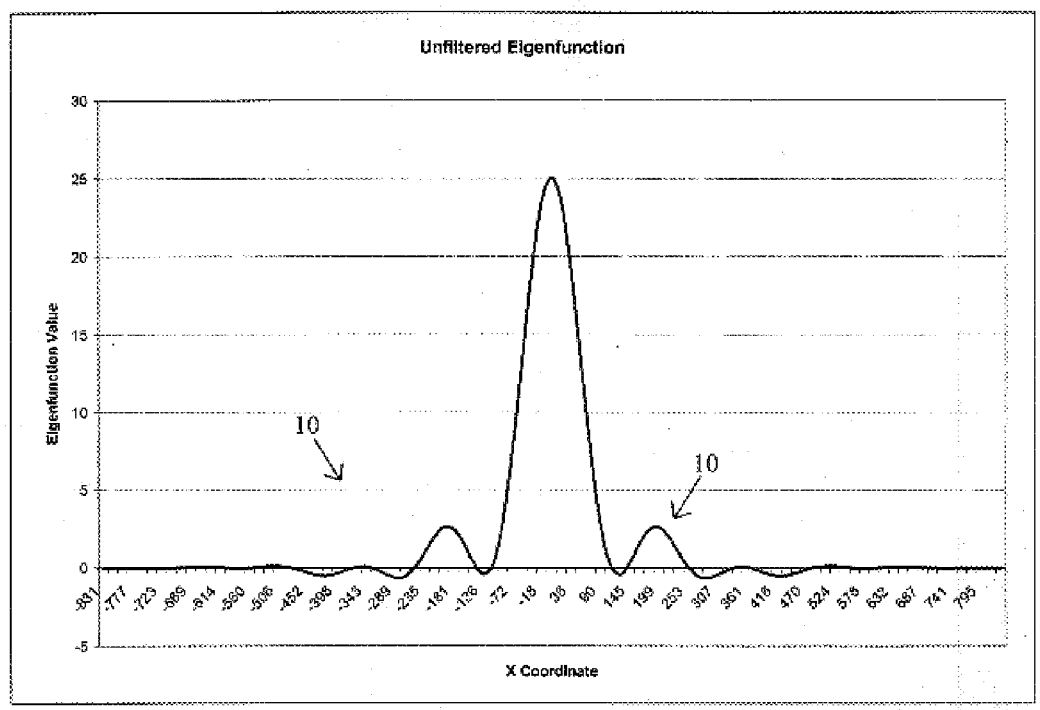
FIG. 1 illustrates a plot of the first eigenfunction of a given optical system.

U.S. patent application Ser. No. 10/756,830 (U.S. patent application Publication No. Pending) filed on Jan. 14, 2004, entitled "Method and Apparatus for Providing Optical Proximity Features to a Reticle Pattern for Deep Sub-Wavelength Optical Lithography" (hereinafter referred to as the '830 application) is incorporated herein by reference in its entirety.

U.S. patent application Ser. No. 10/756,829 (U.S. patent application Publication No. Pending) filed on Jan. 14, 2004, entitled "Method of Optical Proximity Correction Design for Contact Hole Mask" (hereinafter referred to as the '829 application) is incorporated herein by reference in its entirety.

The '830 application describes novel methods for determining assist features, which simultaneously optimizes the desired feature imaging while minimizing the unwanted printing of assist features themselves. Specifically, it teaches a method which allows a full-pitch range of deep sub-wavelength mask patterns to be imaged using substantially any illumination condition, including highly coherent on-axis (partial coherence <0.4) and strong off-axis illuminations (such as, for example, Quasar, double dipole, and single dipole illumination). Assist features are added to a mask pattern that do not print on the wafer (i.e., sub-resolution or non-printing features), but which enhance the aerial image of the intended mask features resulting in higher printing resolution with greater process latitudes. Importantly, the placement of the assist features is determined based on an "Interference Map", which defines whether each point in an optical area of interest interferes constructively or destructively with the desired target pattern.

The '829 application describes ways in which the desired feature printing can be enhanced by determining assist features through generating an interference map that takes into account certain characteristics of an illumination system. Such an interference map may be generated by first developing a "goal function" that captures the essence of the desired imaging behavior of a given mask. For contact printing, the goal function may consist of impulse functions, each representing a contact or bright spot. Next, the eigenfunction that represents the natural response for a given optical system is convolved with the goal function. The resulting image corresponds to an enhanced interference map (taking into account optical system characteristics) that may be used for determining assist features, for focusing light intensity in the areas that will be printed.

For a Chrome Phase Lithography (CPL) mask or a mask with at least two discrete transmission levels, some assist features will be in-phase and others will be out of phase with the primary feature to be printed in order to constructively interfere. In other words, the aerial image of the primary feature, for example, a contact hole, can be improved by placing clear assist features (transmission of 100%) where constructive interference occurs in the interference map. Then the aerial image intensity can be increased further by placing 180° assist features (transmission of −100%) where destructive interference occurs in the interference map; hence creating a CPL mask. In other words, 180° assist features (transmission of −100%) reverse the phase of destructive interference and cause destructive interference areas to contribute constructively to the intensity. This phase reversal of the destructive interference areas causes all areas of the mask to be used constructively which maximizes the intensity for creating the feature/pattern.

While the concepts disclosed by the '830 and '829 applications do indeed describe novel ways in which assist features may be determined, at times, there may be some undesired printing caused by increased intensity or bright spots in the aerial image in the area(s) outside of the feature to be printed caused by the assist features. The novel concepts discussed herein overcome undesirable printing caused by assist features while maintaining the benefits of utilizing assist features. The method described herein further differs from previous methods in that the assist features are relatively large, and the 0-degree and 180-degree assist features abut each other directly, rather than being small openings in an opaque (chrome) background. These larger features may be easier to render accurately in a mask making process, although this advantage is offset by the disadvantage that the positioning of the edges between assist features is more critical than that between an assist feature and its chrome border.

Recall that the eigenfunction for a given optical system represents the natural response of the optical system. It has been shown that a partially coherent imaging system can be decomposed into a series of independent coherent imaging systems. While many different decompositions methods are possible, the often called "optimal coherent decomposition" utilizes the coherent kernels, which are eigenfunctions of a characteristic integral function. The optimal coherent decomposition method utilized herein shall not be limiting to this invention. The operator of the integral equation is entirely determined by the optical imaging system—wavelength, NA, illumination profile, etc. Using this decomposition, the intensity function is as follows:

$$I(x, y) = I_O \sum_{i=1}^{\infty} \lambda_i |M(x, y) * \psi_i(x, y)|^2$$

where

I(x, y)=Intensity Function at the Projection (Wafer) Plane;
$I_O$=Overall Illumination Intensity;
M(x,y)=Effective Complex Mask Transmission Function;
$\psi(x,y)=i^{th}$ Eigenfunction of the Optical System; and
$\lambda_i$=Eigenvalue Corresponding to $\psi_i(x,y)$.

The eigenfunctions are conventionally numbered in order of decreasing eigenvalue. An interference map can be computed using any eigenfunction, and the assist features derived therefrom will "stimulate" the component of the imaging system that the particular eigenfunction represents. However, the efficiency of this "stimulation" decreases as the eigenvalue decreases, which makes the first eigenfunction, $\psi_1$, be the one of greatest interest. Of course, for greater accuracy more than one eigenfunction (preferably including the first eigenfunction) may be utilized for generating an interference map.

Consider a single isolated contact. By convolving the transmission function of this contact with the eigenfunction for a given optical system, an interference map will have a series of bright and dark areas. FIG. 1 illustrates the eigenfunction for a cut line through the single isolated contact. As would be expected, the eigenfunction has side lobes 10, which can be seen in the second, third, etc., eigenfunctions (not shown). These side lobes relate to the placement of either the in-phase assist feature or out-of-phase assist feature, in order to focus as much intensity as possible on the main lobe, corresponding to the feature to be printed. However, when in-phase assist features are "out of balance" with the out-of-phase assist features, there occurs constructive interference in the aerial image outside of the main lobe, or feature to be printed. This causes the undesirable printing to occur and is the result of local imbalances.

Figure 2:
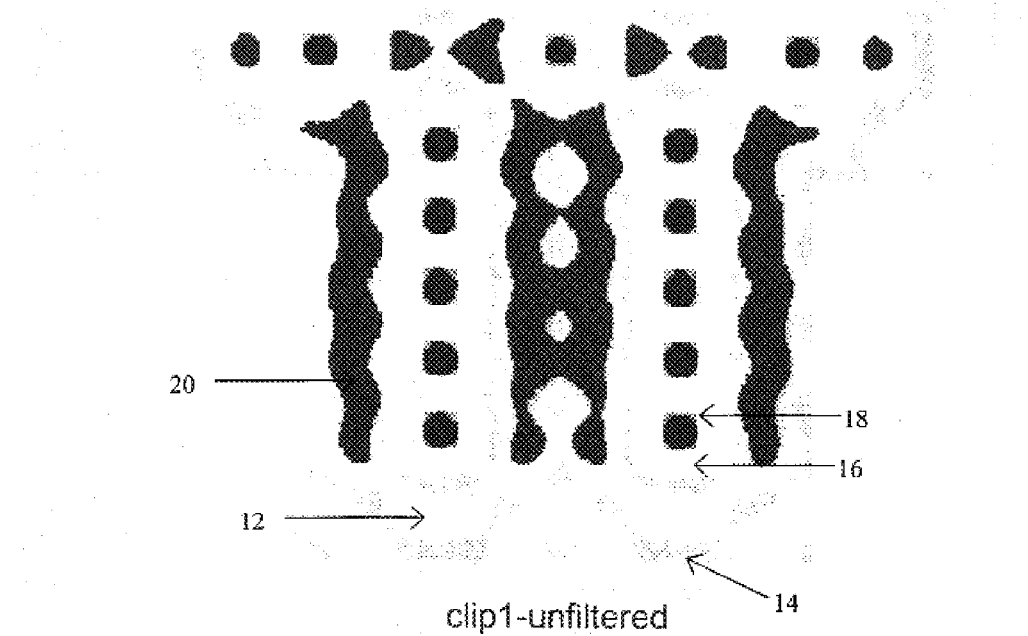
FIG. 2 illustrates a combination image of the desired pattern of contacts, the mask pattern and simulated printing determined using the eigenfunction plotted in FIG. 1.

The undersirable printing may be seen in FIG. 2, which illustrates a combination image of an exemplary pattern of contacts, corresponding mask pattern and the simulated predicted printing utilizing the first eigenfunction illustrated by FIG. 1. Referring to FIG. 2, the in-phase mask area is designated by 12, out-of-phase mask area by 14, chrome mask area by 16, contact pattern by 18 and predicted printing by 20. It will be noted that the eigenfunction of FIG. 1 is not balanced: the positive side-lobes are larger than the negative ones. This fact, combined with constructive interference from groups of closely-spaced contacts, results in an interference map that causes more of the assist-feature area to be covered by 0-degree assist features than by 180-degree assist features. This causes undesired printing on the substrate which corresponds to the predicted printing area 20 outside of the intended contact pattern 18 as shown in FIG. 2.

To minimize undesired printing, the eigenfunction may be modified to encapsulate the preference of not printing undesirable features, such as those caused by assist features. By finely balancing in-phase assist features and out-of-phase assist features, local imbalances are minimized that may cause undesired features to print. This may be accomplished by filtering the eigenfunction so that the entire assist feature areas computed from the filtered function will be approximately balanced. This will retain most of the desired feature printing enhancements developed and described in the '829 and '830 applications.

The reason why local imbalances occur is simple. On a given mask, assist features are no different from a contact. The assist features create areas on the mask that are in-phase or out-of-phase (assuming a two discrete transmission level mask). Considering the mask as a whole, assist features may be primarily in balance. But, considering localized areas of the mask, often it is found that assist features are out of balance. Thus, the goal is to consider the in-phase assist features and out-of-phase assist features that contribute to the local imbalances. These local imbalances are primarily the result of low spatial frequencies in the eigenfunction. Thus, local imbalances can be minimized by examining the high spatial frequencies and removing the low spatial frequencies from the eigenfunction. The low spatial frequencies correspond to relatively large areas of the same phase that contribute significantly to the local imbalances. "Local" relates to an average over a range on the order of λ/NA.

Figure 3:
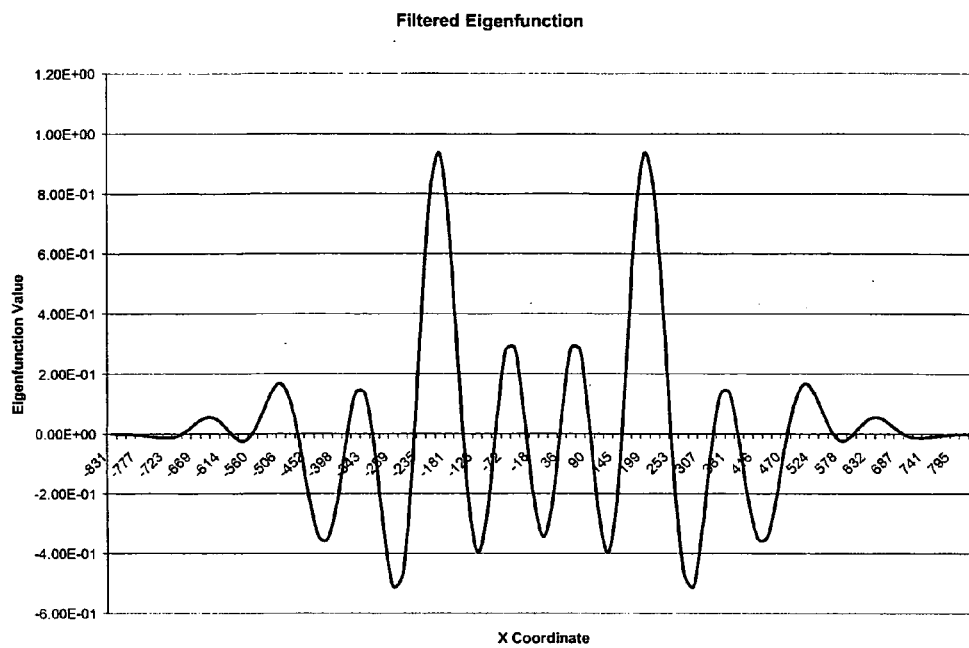
FIG. 3 illustrates a plot of a filtered first eigenfunction of a given optical system in accordance with the disclosed concepts.

By removing the low frequency spatial frequencies from the eigenfunction, the DC component is also removed. However, it is desirable to only filter the eigenfunction in the side lobe areas. If the filtering is performed over the entire eigenfunction, then the main lobe would be lost, and this is the area in which light intensity needs to be maximized. In other words, filtering needs to ignore the main lobe and filter only the part of the function representing the side lobes to remove the DC component and the low spatial frequencies. This filtering will result in approximately an equal area of in-phase and out-of-phase assist features, and can be seen in FIG. 3 illustrating a plot of a filtered first eigenfunction. It should be noted that while tall peaks above zero result, the area of the peaks are balanced by the wide shallow peaks below zero.

Filtering may be performed by utilizing a Gaussian spatial filter which nulls out the area at the origin and then apply a Gaussian spectral filter to remove the low frequencies. Other filters of course can be used, such as a brick wall filter. However, filters with abrupt cutoffs, such as brick wall filters, tend to exhibit "ringing" effects, unduly emphasizing certain frequencies or positions while suppressing others. Thus, a Gaussian filter is preferred because it is a "well-behaved" mathematical function. The mathematical expression for the Gaussian filter is as follows:

$$f_{spatial}(x,y) = 1 - e^{-(x^2+y^2)/R^2}$$

$$f_{spectral}(k_x,k_y) = 1 - e^{-(k_x^2+k_y^2)/\rho^2}$$

where
 (x,y)=Spatial Position (in microns)
 R=Spatial Filter Radius (in microns)
 $(k_x,k_y)$=Spectral Frequency (in radians per micron)
 ρ=Spectral Filter Radius (in radians per micron)

Figure 4:
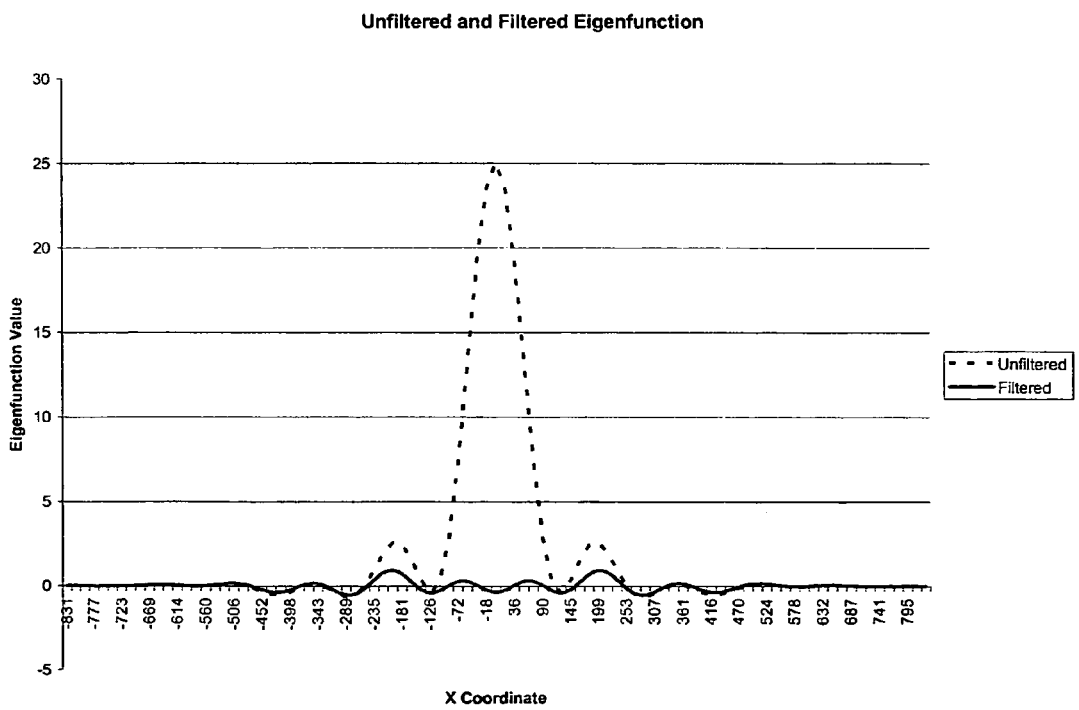
FIG. 4 illustrates a plot of the filtered first eigenfunction of FIG. 3 and the first eigenfunction of FIG. 1.

FIG. 4 illustrates a plot of the filtered first eigenfunction and the unfiltered first eigenfunction. The filtered eigenfunction is convolved with the mask transmission function. Once the assist features are generated, a conventional OPC loop may be performed to achieve desired contact sizes.

Figure 5:
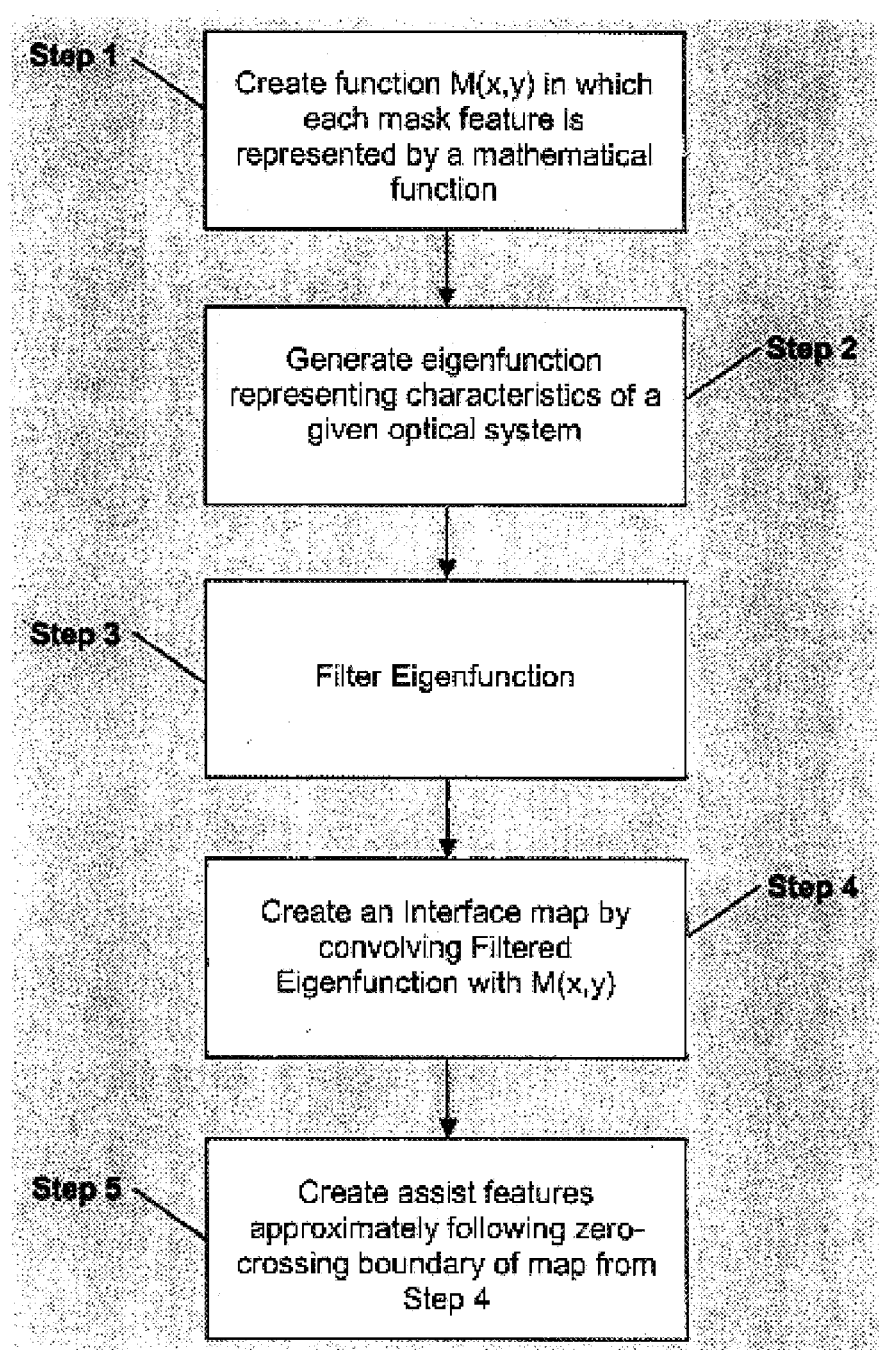
FIG. 5 illustrates a flow chart for generating assist features utilizing the filtered eigenfunction in accordance with the disclosed concepts.

FIG. 5 illustrates a flow chart of the steps for generating a mask utilizing a filtered eigenfunction. In Step 1, the mask pattern is represented by a mathematical expression M(x,y), i.e, the effective complex mask transmission function, and in Step 2, the eigenfunction for a given optical system is generated. As described above and in Step 3, the eigenfunction is filtered in the side lobe areas to remove the DC component and low spatial frequencies. In Step 3, more than one eigenfunction may be filtered, depending on the accuracy desired. In Step 4 and as described above, the filtered eigenfunction from Step 3 is convolved with M(x,y) determined in Step 1 to create an interference map. Recall that the interference map identifies the areas in which in-phase assist features and out-of-phase assist features are needed. The in-phase and out-of-phase assist features are created with edges that follow the boundaries between the positive and negative areas of the interference map. Because the interference map derives from a filtered eigenfunction, it lacks the low spatial frequencies that produce local imbalances between positive and negative areas. It should be noted that the assist features so generated ideally have complex, curved shapes. These can be simplified into polygonal approximations without great loss of effect, provided the simplification is "unbiased"—that is, provided it introduces no net imbalance between in-phase and out-of-phase assist features.

In performing the above analysis, local imbalances that cause undesired feature printing may be minimized. This is further illustrated by the example described below.

EXAMPLE

The invention shall not be limited to the following examples Those of skill in the art will understand and appreciated that various extensions and alternative embodiments are possible.

Consider the example of printing contacts with the following conditions:

| Wavelength: | 248 nm |
| NA: | 0.85 |
| Illuminator: | Quasar (sigma-out = 0.85, sigma-in = 0.61) |
| Contact Size: | 80 nm |
| Minimum Pitch: | 160 nm |

Figure 6:
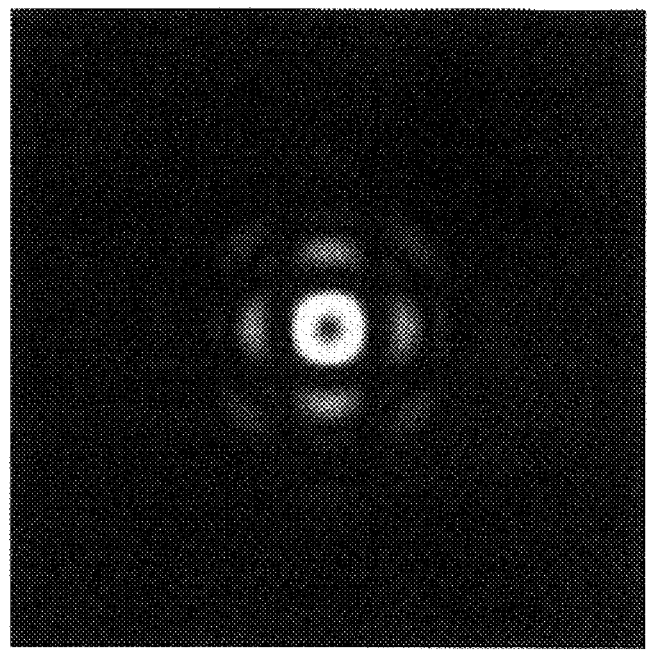
FIG. 6 illustrates an exemplary image of a first eigenfunction in the spatial domain for an optical system utilizing quasar illumination.
Figure 7:
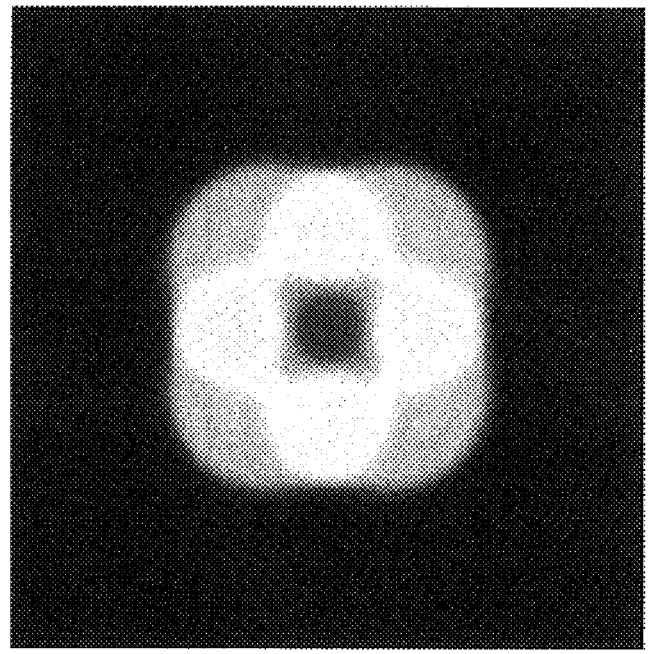
FIG. 7 illustrates an exemplary image of the first eigenfunction in the spectral domain for the optical system utilizing quasar illumination.

An image of the first eigenfunction, unfiltered, in the spatial domain is illustrated by FIG. 6, and an image of the first eigenfunction, unfiltered, in the spectral domain is illustrated by FIG. 7. It can be seen that the positive and negative side-lobes are not well mixed—along the x- and y-axes, after a first positive side-lobe, there is a pair of negative side-lobes that almost merge into one large lobe. Similar behavior can be seen along the diagonals.

Figure 8:
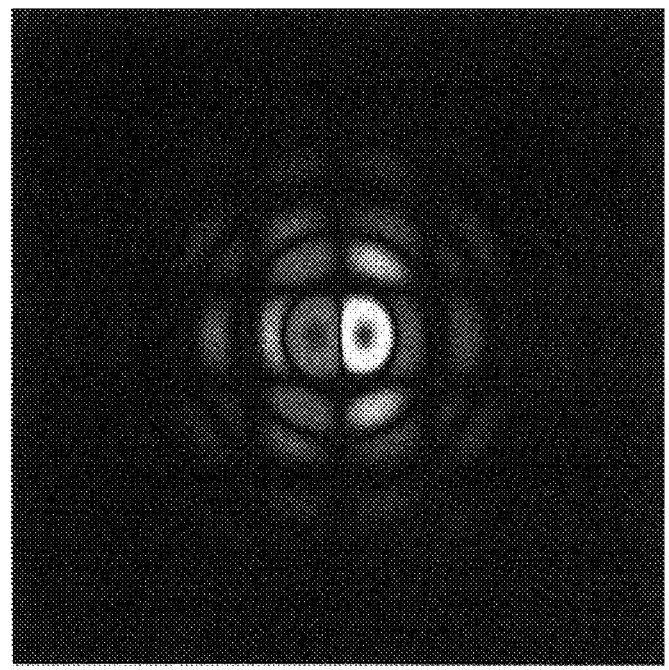
FIG. 8 illustrates an exemplary image of a second eigenfunction in the spatial domain for the optical system utilizing quasar illumination.
Figure 9:
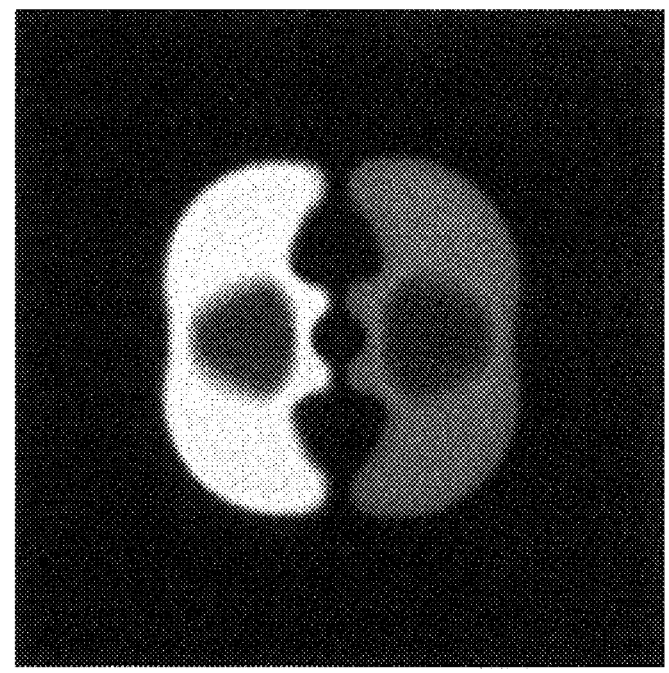
FIG. 9 illustrates an exemplary image of the second eigenfunction in the spectral domain for the optical system utilizing quasar illumination.

An image of the second eigenfunction, unfiltered, in the spatial domain is illustrated by FIG. 8, and an image of the first eigenfunction, unfiltered, in the spectral domain is illustrated by FIG. 9. The second eigenfunction (along with the third eigenfunction, which is exactly a copy of the second eigenfunction, but rotated 90 degrees) is a possible candidate for generating an interference map. In this example, the second eigenvalue is 0.41 times the first eigenvalue, making the second eigenfunction much less useful for determining assist features. Without filtering, this eigenfunction also has large areas where the sign remains nearly constant.

Figure 10:
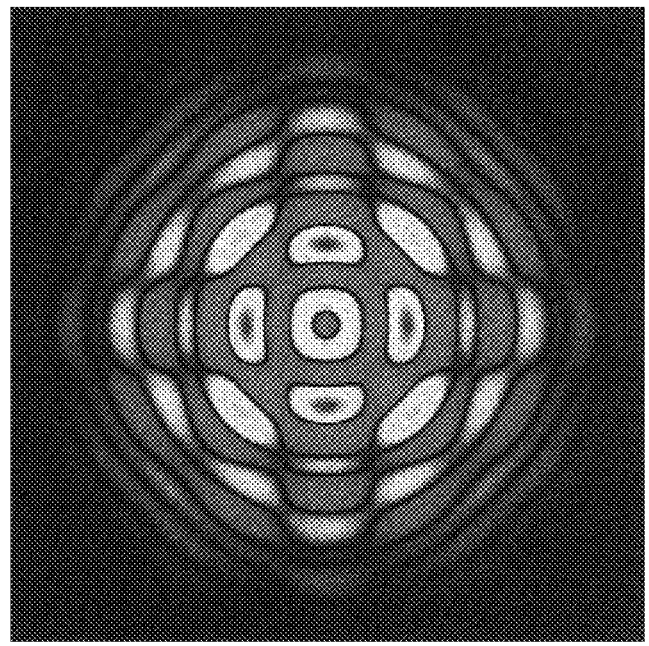
FIG. 10 illustrates an exemplary image of the first eigenfunction that has been filtered in the spatial domain for the optical system utilizing quasar illumination.
Figure 11:
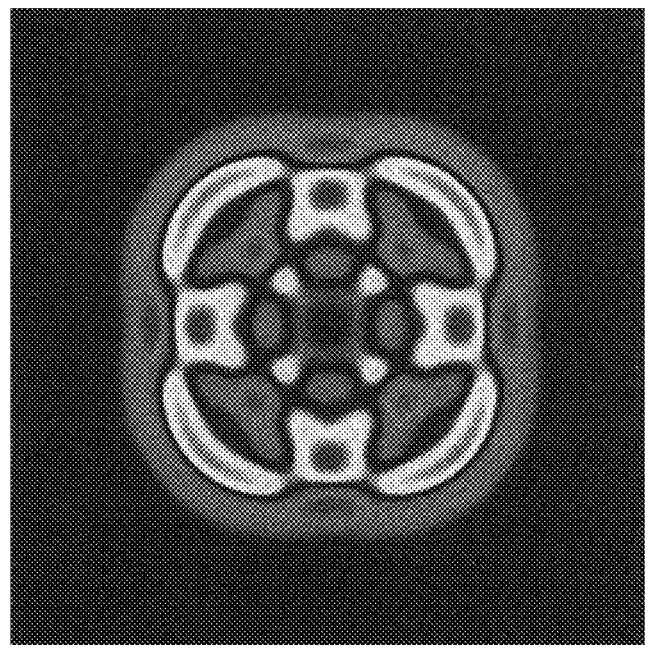
FIG. 11 illustrates an exemplary image of the first eigenfunction that has been filtered in the spectral domain for the optical system utilizing quasar illumination.

The first eigenfunction illustrated by FIGS. 6 and 7 was filtered spatially with a radius of 0.25 μm and spectrally with a radius of 20 radians/μm. FIG. 10 illustrates the filtered first eigenfunction in the spectral domain, and FIG. 11 illustrates the filtered first eigenfunction in the spatial domain. The filtered fiction shows a much more homogeneous mixing of positive and negative lobes; this is due to the spectral high-pass filtering. One can also observe the effect of the spatial filtering step, in that the that the value of this function is low on the central lobe at the origin, relative to the nearby lobes. The function value was exactly zero at the origin after the spatial filtering step, but the following spectral filtering step changed this slightly.

Figure 12:
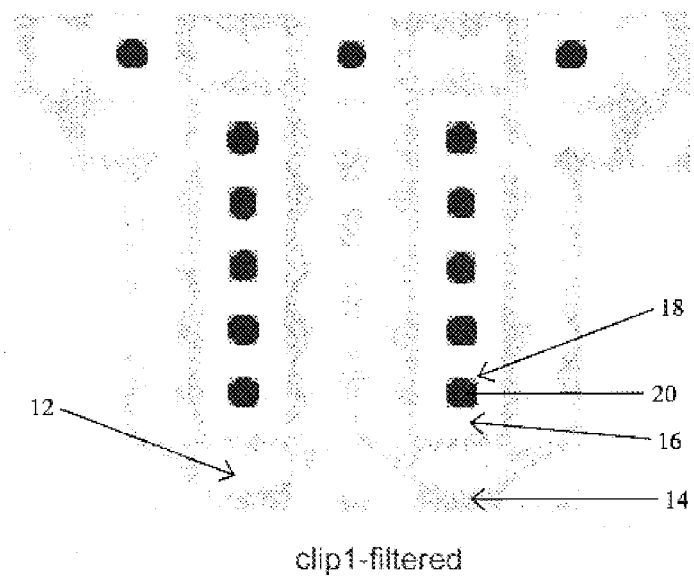
FIG. 12 illustrates a combination image of the desired pattern of contacts, the mask pattern and simulated printing determined using the filtered eigenfunction plotted in FIGS. 10 and 11.

FIG. 12 illustrates a combination image of the desired pattern of contacts, the mask pattern and the simulated predicted printing. The desired pattern of contacts correspond to that illustrated by FIG. 2. Recall that in-phase mask area is designated by 12, out-of-phase mask area by 14, chrome mask area by 16, intended contact pattern by 18 and predicted printing by 20. By comparison with FIG. 2, undesired printing has been eliminated from the simulated predicted printing, and this has been accomplished by filtering the eigenfunction as described herein, thus producing more nearly equal areas of 0-degree and 180-degree assist features.

Figure 13:
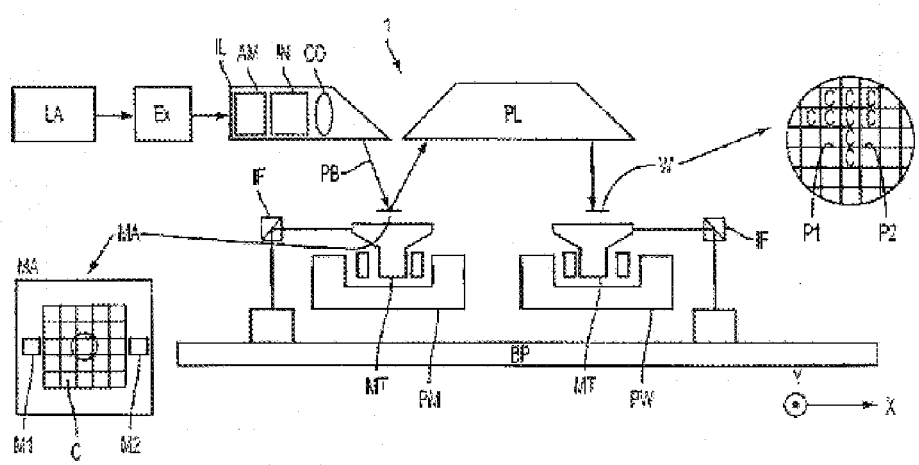
FIG. 13 schematically depicts a lithographic projection apparatus suitable for use with a mask designed with the aid of the current invention.

FIG. 13 schematically depicts a lithographic projection apparatus suitable for use with a mask designed with the aid of the current invention. The apparatus comprises:
 a radiation system Ex, IL, for supplying a projection beam PB of radiation. In this particular case, the radiation system also comprises a radiation source LA;
 a first object table (mask table) MT provided with a mask holder for holding a mask MA (e.g., a reticle), and connected to first positioning means for accurately positioning the mask with respect to item PL;
 a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 13 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 13. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include a 193 nm wavelength generated by an ArF laser, and 157 n wavelength generated by a fluorine laser. Further, EUV (extreme ultra-violet) lithography is capable of producing wavelengths within a range of 20–5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of optimizing an intensity profile of a pattern to be formed in a surface of a substrate relative to a given mask utilizing an optical system, comprising the steps of:
   (a) mathematically representing a goal function representing desired printing behavior of the given mask;
   (b) generating a mathematical expression representing certain characteristics of the optical system;
   (c) modifying the mathematical expression of Step (b);
   (d) generating an interference map in accordance with the result of Step (c) and Step (a); and
   (e) determining assist features for the given mask based on the interference map of Step (d),
      wherein modifying the mathematical expression of Step (b) minimizes undesired printing in the surface of the substrate.

2. The method of optimizing an intensity profile according to claim 1, wherein the mathematical expression generated in Step (b) is at least one eigenfunction representing certain characteristics of the optical system.

3. The method of optimizing an intensity profile according to claim 2, wherein modifying the mathematical expression of Step (b) includes filtering the at least one eigenfunction.

4. The method of optimizing an intensity profile according to claim 3, wherein the at least one eigenfunction is filtered relative to the sidelobes of the eigenfunction.

5. The method of optimizing an intensity profile according to claim 3, wherein the at least one eigenfunction is filtered outside of the main lobe of the eigenfunction.

6. The method of optimizing an intensity profile according to claim 3, wherein the filtering removes the DC component or certain low spatial frequencies of the eigenfunction.

7. The method of optimizing an intensity profile according to claim 3, wherein the filtering enhances the eigenfunction for minimizing local imbalances of in-phase assist features and out-of-phase assist features generated in Step (e).

8. The method of optimizing an intensity profile according to claim 3, wherein the interference map in Step (d) is generated by convolving the result of Step (a) with the result of Step (c).

9. The method of optimizing an intensity profile according to claim 1, wherein step (e) includes selecting in-phase assist features and out-of-phase assist features corresponding to the interference map.

10. A program product, comprising executable code transportable by at least one machine readable medium, wherein execution of the code by at least one programmable computer causes the at least one programmable computer to perform a sequence of steps for optimizing an intensity profile of a pattern to be formed in a surface of a substrate for a given mask utilizing an optical system, compromising:
    (a) mathematically representing a goal function representing desired printing behavior of the given mask;
    (b) generating a mathematical expression representing certain characteristics of the optical system;
    (c) modifying the mathematical expression of Step (b);
    (d) generating an interference map in accordance with the result of Step (c) and Step (a); and
    (e) determining assist features for the given mask based on the interference map of Step (d),
       wherein modifying the mathematical expression of Step (b) minimizes undesired printing in the surface of the substrate.

11. The method of optimizing an intensity profile according to claim 10, wherein the mathematical expression generated in Step (b) is at least one eigenfunction representing certain characteristics of the optical system.

12. The method of optimizing an intensity profile according to claim 11, wherein modifying the mathematical expression of Step (b) includes filtering the at least one eigenfunction.

13. The method of optimizing an intensity profile according to claim 12, wherein the at least one eigenfunction is filtered relative to the sidelobes of the eigenfunction.

14. The method of optimizing an intensity profile according to claim 12, wherein the at least one eigenfunction is filtered outside of the main lobe of the eigenfunction.

15. The method of optimizing an intensity profile according to claim 12, wherein the filtering removes the DC component or certain low spatial frequencies of the eigenfunction.

16. The method of optimizing an intensity profile according to claim 12, wherein the filtering enhances the eigenfunction for minimizing local imbalances of in-phase assist features and out-of-phase assist features generated in Step (e).

17. The method of optimizing an intensity profile according to claim 12, wherein the interference map in Step (d) is generated by convolving the result of Step (a) with the result of Step (c).

18. The method of optimizing an intensity profile according to claim 10, wherein step (e) includes selecting in-phase assist features an out-of-phase assist features corresponding to the interference map.

19. A method of designing an optimal mask, comprising the steps of:
    (a) generating an intensity profile of a pattern to be formed in a surface of a substrate relative to a given mask utilizing an optical system;
    (b) mathematically representing a goal function representing desired printing behavior of the given mask;
    (c) generating a mathematical expression representing certain characteristics of the optical system;
    (d) modifying the mathematical expression of Step (c);
    (e) generating an interference map in accordance with the result of Step (d) and Step (b); and
    (f) determining assist features for the given mask based on the interference map of Step (e), wherein modifying the mathematical expression of Step (c) minimizes undesired printing in the surface of the substrate.

20. The method of optimizing an intensity profile according to claim 19, wherein the mathematical expression generated in Step (c) is at least one eigenfunction representing certain characteristics of the optical system.

21. The method of optimizing an intensity profile according to claim 20, wherein modifying the mathematical expression of Step (c) includes filtering the at least one eigenfunction.

22. The method of optimizing an intensity profile according to claim 21, wherein the at least one eigenfunction is filtered relative to the sidelobes of the eigenfunction.

23. The method of optimizing an intensity profile according to claim 21, wherein the at least one eigenfunction is filtered outside of the main lobe of the eigenfunction.

24. The method of optimizing an intensity profile according to claim 21, wherein the filtering removes the DC component or certain low spatial frequencies of the eigenfunction.

25. The method of optimizing an intensity profile according to claim 21, wherein the filtering enhances the eigenfunction for minimizing local imbalances of in-phase assist features and out-of-phase assist features generated in Step (f).

26. The method of optimizing an intensity profile according to claim 21, wherein the interference map in Step (e) is generated by convolving the result of Step (b) with the result of Step (d).

27. The method of optimizing an intensity profile according to claim 20, wherein step (f) includes selecting in-phase assist features and out-of-phase assist features corresponding to the interference map.

* * * * *